United States Patent
Ohmi et al.

(10) Patent No.: US 7,083,701 B2
(45) Date of Patent: Aug. 1, 2006

(54) DEVICE AND METHOD FOR PLASMA PROCESSING, AND SLOW-WAVE PLATE

(75) Inventors: Tadahiro Ohmi, Sendai (JP); Masaki Hirayama, Sendai (JP); Shigetoshi Sugawa, Sendai (JP); Tetsuya Goto, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 297 days.

(21) Appl. No.: 10/296,619

(22) PCT Filed: Mar. 28, 2002

(86) PCT No.: PCT/JP02/03112

§ 371 (c)(1),
(2), (4) Date: Nov. 26, 2002

(87) PCT Pub. No.: WO02/080253

PCT Pub. Date: Oct. 10, 2002

(65) Prior Publication Data

US 2004/0134613 A1 Jul. 15, 2004

(30) Foreign Application Priority Data

Mar. 28, 2001 (JP) ............................... 2001-94276

(51) Int. Cl.
*H01L 21/306* (2006.01)
*C23C 16/00* (2006.01)
(52) U.S. Cl. .................. 156/345.41; 118/723 MW
(58) Field of Classification Search ....... 118/723 MW, 118/723 ME, 723 MR, 723 MA, 723 AN; 156/345.41, 345.42
See application file for complete search history.

(56) References Cited

U.S. PATENT DOCUMENTS

| 5,698,036 A | 12/1997 | Ishii et al. |
| 6,123,775 A * | 9/2000 | Hao et al. .................. 118/724 |
| 6,388,632 B1 * | 5/2002 | Murakawa et al. ......... 343/770 |
| 6,830,652 B1 * | 12/2004 | Ohmi et al. ........... 156/345.41 |
| 2004/0011467 A1 * | 1/2004 | Hemker et al. ......... 156/345.49 |

FOREIGN PATENT DOCUMENTS

| JP | 9-63793 | 3/1997 |
| JP | 09-063793 | 3/1997 |
| JP | 2000-077335 | 3/2000 |
| JP | 268996 | 9/2000 |
| JP | 2000-286237 | 10/2000 |
| JP | 2000-286240 | 10/2000 |
| JP | 277508 | 10/2000 |
| JP | 286237 | 10/2000 |
| JP | 2001-203098 | 7/2001 |
| WO | WO 00/74127 A1 | 12/2000 |

* cited by examiner

*Primary Examiner*—Luz Alejandro-Mulero
(74) *Attorney, Agent, or Firm*—Finnegan, Henderson, Farabow, Garrett & Dunner, LLP

(57) ABSTRACT

In a microwave plasma processing apparatus that uses a radial line slot antenna, a slot plate (16) is formed by a material having a thermal expansion rate close to the wave retardation plate (18), or depositing a metal on a dielectric plate constituting the wave retardation plate (18). An intimate contact between the wave retardation plate and a slot plate constituting a microwave radiation surface is improved so as to prevent an abnormal electric discharge.

6 Claims, 10 Drawing Sheets

SOLDERING

SOLDERING

DEVICE AND METHOD FOR PLASMA PROCESSING, AND SLOW-WAVE PLATE

TECHNICAL FIELD

The present invention generally relates to plasma processing apparatuses and, more particularly, to a microwave plasma processing apparatus.

Plasma process and plasma processing apparatus are indispensable technology for fabricating ultrafine semiconductor devices of these days called deep submicron devices or deep subquarter micron devices characterized by a gate length of near 0.1 μm or less, or for fabricating ultra high-resolution flat-panel display devices including liquid crystal display devices.

Conventionally, various plasma excitation methods have been used in plasma processing apparatuses used for fabrication of semiconductor devices or liquid crystal display devices. Particularly, a parallel-plate type high-frequency excitation plasma processing apparatus or an induction-coupled plasma processing apparatus are used commonly. However, such conventional plasma processing apparatuses have a drawback of non-uniform plasma formation in that the region of high electron density is limited, and it has been difficult to conduct a uniform process over the entire substrate surface with large processing rate, and hence with large throughput. This problem becomes particularly acute when processing a large diameter substrate. Further, such a conventional plasma processing device has several inherent problems, associated with its high electron temperature, in that the semiconductor devices formed on the substrate undergo damaging and that significant metal contamination is caused as a result of sputtering of a chamber wall. Thus, there are increasing difficulties in such conventional plasma processing apparatuses to meet for the stringent demand of further device miniaturization and further improvement of productivity of semiconductor devices or liquid crystal display devices.

Meanwhile, there are proposals of a microwave plasma processing apparatus that uses high-density plasma excited by a microwave electric field, in place of a direct-current magnetic field. For example, there is a proposal of a plasma processing apparatus that causes excitation of plasma by radiating a microwave into a processing vessel from a planar antenna (radial line slot antenna) having a number of slots disposed so as to form a uniform microwave, such that the microwave electric field causes ionization of a gas in a vacuum vessel. (See for example Japanese Laid-Open Patent Application 9-63793). In the microwave plasma thus excited, it is possible to realize a high plasma density over a wide area right underneath the antenna, and it becomes possible to conduct uniform plasma processing in a short duration. The microwave plasma thus formed is characterized by low electron temperature, and damaging or metal contamination of the substrate is avoided. Further, it is possible to form uniform plasma over a large surface area, and it can be easily applied to the fabrication process of a semiconductor device using a large diameter semiconductor substrate or large size liquid crystal display device.

BACKGROUND ART

FIGS. 1A and 1B show the construction of a conventional microwave plasma processing apparatus 100 having such a radial line slot antenna. Where, FIG. 1A shows the microwave plasmas processing apparatus in a cross-sectional view, while FIG. 1B shows the construction of the radial line slot antenna.

Referring to FIG. 1A, the microwave plasma processing apparatus 100 has a processing chamber 101 evacuated from plural evacuation ports 116, and there is formed a stage 115 for holding a substrate 114 to be processed. In order to realize uniform processing in the processing chamber 101, a ring-shaped space 101A is formed around the stage 115, and the plural evacuation ports 116 are formed in communication with the foregoing space 101A with a uniform interval, and hence in axial symmetry with regard to the substrate. Thereby, it becomes possible to evacuate the processing chamber 101 uniformly through the space 101A and the evacuation ports 116.

On the processing chamber 101, there is formed a plate 103 of plate-like form at the location corresponding to the substrate 114 on the stage 115 as a part of the outer wall of the processing chamber 101 via a seal ring 109, wherein the shower plate 103 is formed of a dielectric material of small loss and includes a large number of apertures 107. Further, a cover plate 102 also of a dielectric material of small loss is provided on the outer side of the shower plate 103 via another seal ring 108.

The shower plate 103 is formed with a passage 104 of a plasma gas on the top surface thereof, and each of the plural apertures 107 are formed in communication with the foregoing plasma gas passage 104. Further, there is formed a plasma gas supply passage 106 in the interior of the shower plate 103 in communication with a plasma gas supply port 105 provided on the outer wall of the processing vessel 101. Thus, the plasma gas of Ar, Kr or the like supplied to the foregoing plasma gas supply port 105 is supplied to the foregoing apertures 107 from the supply passage 106 via the passage 104 and is released into a space 103B right underneath the shower plate 103 in the processing vessel 101 from the apertures 107 with substantially uniform concentration.

On the processing vessel 101, there is provided a radial line slot antenna 110 having a radiation surface shown in FIG. 1B on the outer side of the cover plate 102 with a separation of 4–5 mm from the cover plate 102. The radial line slot antenna 110 is connected to an external microwave source (not shown) via a coaxial waveguide 110A and causes excitation of the plasma gas released into the space 101B by the microwave from the microwave source. It should be noted that the gap between the cover plate 102 and the radiation surface of the radial line slot antenna 110 is filled with the air.

The radial line slot antenna 110 is formed of a flat disk-like antenna body 110B connected to an outer waveguide of the coaxial waveguide 110A and a radiation plate 110C is provided on the mouth of the antenna body 110B, wherein the radiation plate 110C is formed with a number of slots 110a and slots 110b wherein slots 110b are formed in a direction crossing the slots 110a perpendicularly as represented in FIG. 1B. Further, a wave retardation plate 110D of a dielectric film of uniform thickness is inserted between the antenna body 110B and the radiation plate 11C.

In the radial line slot antenna 110 of such a construction, the microwave supplied from the coaxial waveguide 110 spreads between the disk-like antenna body 110B and the radiation plate 110C as it is propagated in the radial direction, wherein there occurs a compression of wavelength as a result of the action of the wave retardation plate 110D. Thus, by forming the slots 110a and 110b in concentric relationship in correspondence to the wavelength of the radially propagating microwave so as to cross perpendicularly with each other, it becomes possible to emit a plane wave having a circular polarization state in a direction substantially perpendicular to the radiation plate 110C.

By using such a radial line slot antenna 110, uniform plasma is formed in the space 101B right underneath the shower plate 103. The high-density plasma thus formed is characterized by a low electron temperature and thus, there is caused no damaging of the substrate 114 and there is caused no metal contamination as a result of the sputtering of the vessel wall of the processing vessel 101.

In the plasma processing apparatus of FIG. 1, it should further be noted that there is provided a conductive structure 111 in the processing vessel 101 between the shower plate 103 and the substrate 114, wherein the conductive structure is formed with a number of nozzles 113 supplied with a processing gas from an external processing gas source (not shown) via a processing gas passage 112 formed in the processing vessel 101, and each of the nozzles 113 releases the processing gas supplied thereto into a space 101C between the conductive structure 111 and the substrate 114. It should be noted that the conductive structure 111 is formed with openings between adjacent nozzles 113 with a size such that the plasma formed in the space 101B passes efficiently from the space 101B to the space 101C by way of diffusion.

Thus, in the case a processing gas is released into the space 101C from the conductive structure 111 via the nozzles 113, the processing gas is excited by the high-density plasma formed in the space 101B and a uniform plasma processing is conducted on the substrate 114 efficiently and with high rate, without damaging the substrate or the devices on the substrate, and without contaminating the substrate. Further, it should be noted that the microwave emitted from the radial line slot antenna is blocked by the conductive structure and there is no possibility of such a microwave causes damaging in the substrate 114.

Meanwhile, the density of the plasma formed in the space 101B can reach the order of $10^{12}/cm^3$ in such a plasma processing apparatus 110 that uses the radial line slot antenna 110. Thus, the shower plate 103 is exposed to a large amount of ions and electrons constituting the high-density plasma, and the ions and electrons thus formed cause heating. The thermal flux caused by such ions and electrons can reach the value of as much as 1–2 W/cm². In view of the fact that the plasma processing apparatus 100 is frequently operated by maintaining the wall temperature of the processing chamber 101 to about 150° C. so as to suppress formation of deposits on the processing chamber 101, there is caused accumulation of heat in the shower plate 103 and the cover plate 102 formed of a dielectric material, as a result of heating of the processing chamber 101. As a result, there is formed a very large temperature distribution.

In order to reduce such accumulation of heat in the shower plate 103 and the cover plate 102, it is preferable that the radial line slot antenna 110 is made close contact to the cover plate 102 so as to remove the heat by using the antenna 110 as a heat sink. However, since the radiation plate 110C is fixed by screws to a central conductor of the coaxial waveguide 110A in the conventional radial line slot antenna 110, a space for the screw heads must be retained between the cover plate 102 and the radiation plate 110C, and, thus, it is difficult to adopt such a structure.

Additionally, in the conventional plasma processing apparatus 100, the radial line slot antenna 110 is subjected to substantial heating and the temperature thereof is increased even when not closely contact to the cover plate 102 due to the heat flux from the shower plate 103 and the cover plate 102. Moreover, when the radial line slot antenna 110 is made closely contact, the temperature rise of the antenna becomes still larger.

The conventional radial line slot antenna is not designed on the assumption of usage under such a high-temperature environment, and, therefore, if the temperature of the antenna rises in this way, a gap may be produced between the dielectric plate 110D provided as a wave retardation plate and the radiation plate 110C due to a difference in coefficients of thermal expansion. Thus, if such a gap is produced between the wave retardation plate 110D and the radiation plate 110C, the impedance which the microwave propagating inside the waver retardation plate senses is disturbed, and there occurs a problem such as an abnormal discharge, a formation of a reflection wave or a formation of a stationary wave within the antenna. If an abnormal discharge occurs, use of the antenna will become impossible thereafter.

DISCLOSURE OF THE INVENTION

Accordingly, it is an object of the present invention to provide a novel and useful plasma processing apparatus wherein the foregoing problems are eliminated.

A more specific object of the present invention is to improve, in a plasma processing apparatus using a radial line slot antenna, an intimate contact between a wave retardation plate and a radiation plate in the radial line slot antenna Another object of the present invention is to provide, in a plasma processing apparatus using a radial line slot antenna, a structure that can radiate a microwave stably even when the antenna is heated.

Still another object of the present invention is to provide a plasma processing apparatus, comprising:

a processing vessel defined by an outer wall and having a stage for holding a substrate to be processed;

an evacuation system coupled to said processing vessel;

a plasma gas supplying part supplying plasma gas to said processing vessel; and a microwave antenna provided on said processing vessel in correspondence to said plasma gas supplying part and supplied with an electric power from a coaxial waveguide, wherein said microwave antenna comprises: a radial line back surface metal plate having openings; a microwave radiation surface provided on said radial line back surface metal plate so as to cover said openings and having a plurality of slots; and a dielectric plate provided between said radial line back surface metal plate and said microwave radiation surface, wherein said microwave radiation surface is formed by an electrically conductive material that causes a difference in a coefficient of thermal expansion between said dielectric plate being within 10% with respect to a coefficient of thermal expansion of said dielectric plate.

According to the present invention, since the difference in coefficient of thermal expansion between the wave retardation plate in the radial line slot antenna and the slot plate constituting the radiation surface is controlled to be within 10%, there is no problem occurs such that a gap is formed in the antenna even if the antenna is heated by plasma, thereby preventing a problem associated with an abnormal discharge, formation of a reflection wave or formation of a stationary wave.

Another object of the present invention is to provide a plasma processing apparatus, comprising:

a processing vessel defined by an outer wall and having a stage for holding a substrate to be processed;

an evacuation system coupled to said processing vessel;

a plasma gas supplying part supplying plasma gas to said processing vessel; and a microwave antenna provided on said processing vessel in correspondence to said plasma gas supplying part and supplied with an electric power from a coaxial waveguide, wherein said microwave antenna comprises: a radial line back surface metal plate having openings;

a microwave radiation surface provided on said radial line back surface metal plate so as to cover said openings and having a plurality of slots; and a dielectric plate provided between said radial line back surface metal plate and said microwave radiation surface, wherein said microwave radiation surface is formed by a plating layer of an electrically conductive material formed on said dielectric plate.

In the present invention, fine unevenness on the wave retardation plate is filled by the plating layer by forming the slot plate on the wave retardation plate by plating, which enables realization of an ideal intimate contact between the slot plate and the wave retardation plate.

Another object of the present invention is to provide a plasma processing apparatus, comprising:

a processing vessel having a stage on which a substrate to be processed is placed thereon;

a microwave generator generating microwave so as to supply the microwave to said processing vessel;

a wave retardation plate provided between the microwave generator and said processing vessel so as to reduce a wavelength of the microwave supplied by said microwave generator; and a microwave radiation member which radiates a microwave of which wavelength is shortened by the wave retardation plate to a space of said processing vessel, wherein a metal layer is formed at least an upper surface and a lower surface of said wave retardation plate, and said microwave radiation member is constituted by said metal plate formed on a surface of said wave retardation plate.

In the present invention, since the plating layer is formed on at least the upper surface and the lower surface of the wave retardation plate and the plating layer of the lower surface is caused to function as the microwave radiation member, there is no problem occurs such that a gap is formed in the antenna even if the antenna is heated by plasma. Accordingly, it is possible to prevent a problem associated with an abnormal discharge, formation of a reflection wave or formation of a stationary wave. Additionally, since there is no gap formed between a metal part and the wave retardation plate in the upper portion of the wave retardation plate, the microwave radiation characteristic is stabilized. Additionally, according to the above-mentioned invention, since the microwave radiation member is formed by a metal layer, the thickness of the slot part is reduced, which can suppress reflection of the microwave caused by a cutoff phenomenon in the slot part, thereby improving the radiation efficiency.

Another object of the present invention is to provide a plasma processing method using a microwave plasma processing apparatus comprising: a processing vessel defined by an outer wall and having a stage for holding a substrate to be processed; a microwave generator generating a microwave so as to supply the microwave to said processing vessel; a wave retardation plate provided between the microwave generator and said processing vessel so as to reduce a wavelength of the microwave supplied by said microwave generator; and a microwave radiation member formed by a part of said metal layer formed on a surface of said wave retardation plate, the method comprising:

placing said substrate on said stage so that a processing surface of said substrate faces said microwave radiation member;

supplying the microwave to said wave retardation plate so as to introduce the microwave into said processing vessel from many slots formed in a part of the metal layer; and generating plasma within said processing vessel by the introduced microwave so as to apply a plasma process to said substrate by the generated plasma.

Another object of the present invention is to provide a wave retardation plate used in a microwave plasma processing apparatus comprising a processing vessel to apply plasma processing and a microwave generator generating a microwave so as to supply the microwave to said processing vessel, wherein said wave retardation plate reduces a wavelength of the microwave supplied by said microwave generator, wherein at least an upper surface and a lower surface are covered by a metal layer, and a microwave radiation member is formed by a part of the metal layer.

In the present invention, since the microwave radiation member is integrally formed, as a part of the metal layer, with the wave retardation plate, there is no need to produce the wave retardation plate and the microwave radiation member as separate parts and bond them to each other. Thereby, a formation of a gap between the wave radiation plate and the microwave retardation plate due to a thermal expansion or a change with age is prevented. Thus, a plasma process can be performed with less variation with time and good reproducibility. Additionally, since the entire wave retardation plate is almost covered by the metal plating layer, a microwave supplied to the wave retardation plate is introduced into the processing vessel without leakage, which results in an efficient plasma generation.

BEST MODE FOR CARRYING OUT THE INVENTION

Hereinafter, the present invention will be described in detail with reference to embodiments.

FIRST EMBODIMENT

Figure 2A:
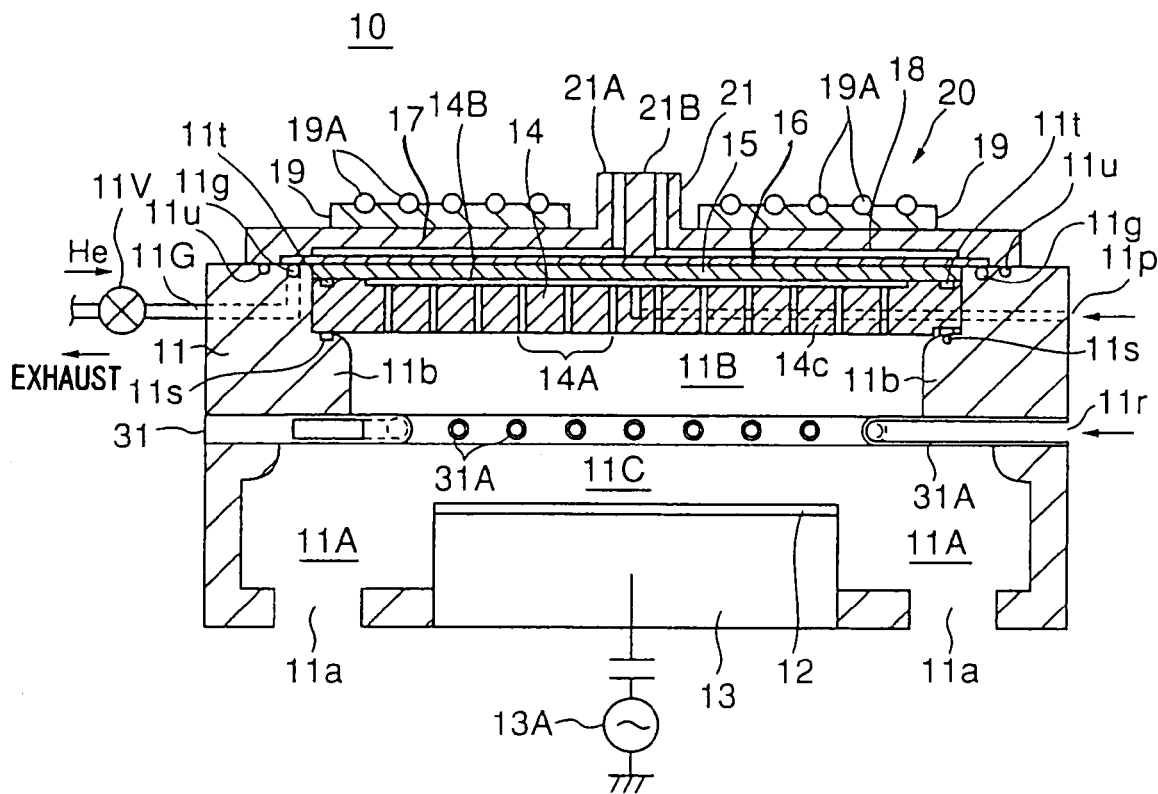
FIGS. 2A and 2B are diagrams showing the construction of a microwave plasma processing apparatus according to a first embodiment of the present invention.
Figure 2B:
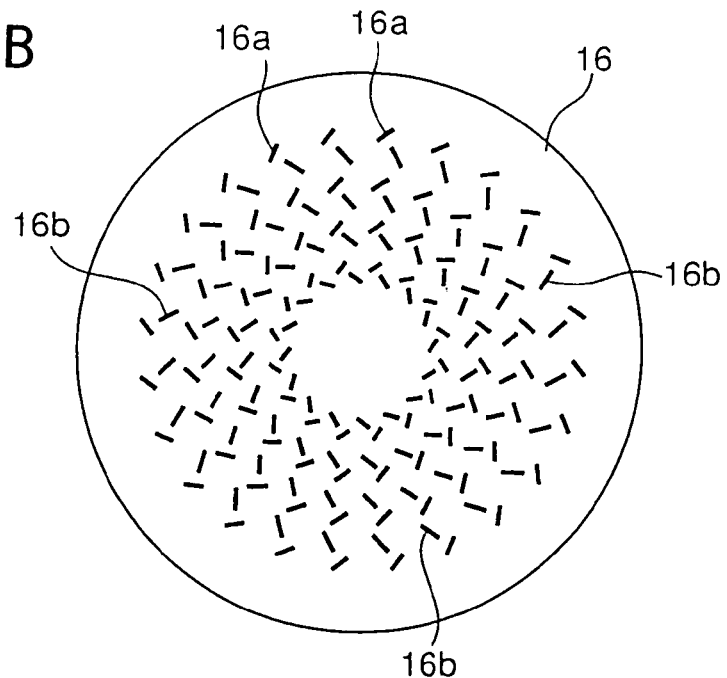

FIGS. 2A and 2B are diagrams showing the construction of a microwave plasma processing apparatus 10 according to a first embodiment of the present invention.

Referring to FIG. 2A, the microwave plasma processing apparatus 10 includes a processing vessel 11 and a stage 13 provided in the processing vessel 11 for holding a substrate 12 to be processed by an electrostatic chuck, wherein the stage 13 is preferably formed of AlN or $Al_2O_3$ by a hot isostatic pressing (HIP) process. In the processing vessel 11, there are formed two or three evacuation ports 11a in a space 11A surrounding the stage 13 with an equal distance, and hence with an axial symmetry with respect to the substrate 12 on the stage 13. The processing vessel 11 is evacuated to a low pressure via the evacuation port 11a by a gradational lead screw pump to be explained later.

The processing vessel 11 is preferably formed of an austenite stainless steel containing Al, and there is formed a protective film of aluminum oxide on the inner wall surface by an oxidizing process. Further, there is formed a disk-shaped shower plate 14 of dense $Al_2O_3$, formed by a HIP process, in the part of the outer wall of the processing vessel 11 corresponding to the substrate 12 as a part of the outer wall, wherein the shower plate 14 includes a large number of nozzle apertures 14A. The $Al_2O_3$ shower plate 14 thus formed by a HIP process is formed by using an $Y_2O_3$ additive and has porosity of 0.03% or less. This means that the $Al_2O_3$ shower plate is substantially free from pores or pinholes and has a very large, while not so large as that of AlN, thermal conductivity for a ceramic of 30 W/m·K.

The shower plate 14 is mounted on the processing vessel 11 via a seal ring 11s, and a cover plate 15 of dense $Al_2O_3$ formed also of an HIP process is provided on the shower plate 14 via a seal ring 1it. The shower plate 14 is formed with a depression 14B communicating with each of the nozzle apertures 14A and serving for the plasma gas passage, at the side thereof contacting with the cover plate 15, wherein the depression 14B also communicates with another plasma gas passage 14C formed in the interior of the shower plate 14 in communication with a plasma gas inlet lip formed on the outer wall of the processing vessel 11.

The shower plate 14 is held by an extending part 11b formed on the inner wall of the processing vessel 11, wherein the extending part 11b is formed with a round surface at the part holding the shower plate 14 so as to suppress electric discharge.

Thus, the plasma gas such as Ar or Kr supplied to the plasma gas inlet lip is supplied to a space 11B right underneath the shower plate 14 uniformly via the apertures 14A after being passed through the passages 14C and 14B in the shower plate 14.

On the cover plate 15, there is provided a radial line slot antenna 20 formed of a disk-shaped slot plate 16 formed with a number of slots 16a and 16b shown in FIG. 2B in intimate contact with the cover plate 15, a disk-shaped antenna body 17 holding the slot plate 16, and a retardation plate 18 of a dielectric material of low loss such as $Al_2O_3$, $SiO_2$ or $Si_3N_4$ sandwiched between the slot plate 16 and the antenna body 17. The above-mentioned slot plate 16 preferably consists of Cu (copper) containing W (tungsten) up to 10 wt %. Especially, in a case where $Al_2O_3$ having a coefficient of thermal expansion of $7-8 \times 10^{-6}/°$ C. is used as the slot plate 16, the difference in the coefficient of thermal expansion between the wave retardation plate 18 can be suppressed equal to or less than 10% by using a Cu—W alloy having a coefficient of thermal expansion of about $7 \times 10^{-6}/°$ C. Since the resistivity of the Cu—W alloy is comparatively large, when using as a slot plate 16 of the radial line slot antenna, it is preferable to form thereon a low resistance layer 16r, such as Au (gold), Ag (silver) or copper (Cu), in the thickness of about 3 μm or more in consideration of the skin effect of microwave, as shown in the enlarged view of FIG. 3.

The low resistance layer 16r can be easily formed by, for example, electrolysis plating or the like. The slot plate 16 can be bonded to the wave retardation plate 18 by a ceramic adhesive. As for the typical ceramic adhesive, one having alumina particles dispersed into a solvent is commercially available. After adhesion, the solvent is volatilized by annealing at 200–300° C., and the firm adhesion layer 18l shown in FIG. 3 having no microwave loss can be obtained.

The radial line slot antenna 20 is mounted on the processing vessel 11 by way of a seal ring 11u, and a microwave of 2.45 GHz or 8.3 GHz frequency is fed to the radial line slot antenna 20 from an external microwave source (not shown) via a coaxial waveguide 21. The microwave thus supplied is radiated into the interior of the processing vessel from the slots 16a and 16b on the slot plate 16 via the cover plate 15 and the shower plate 14, thereby causing excitation of plasma in the plasma gas supplied from the apertures 14A in the space 11B right underneath the shower plate 14. It should be noted that the cover plate 15 and the shower plate 14 are formed of $Al_2O_3$ and function as an efficient microwave-transmitting window. In order to avoid plasma excitation in the plasma gas passages 14A–14C, the plasma gas is held at the pressure of about 6666 Pa–13332 Pa (about 50–100 Torr) in the foregoing passages 14A–14C.

In order to improve intimate contact between the radial line slot antenna 20 and the cover plate 15, the microwave plasma processing apparatus 10 of the present embodiment has a ring-shaped groove 11g on a part of the processing vessel 11 so as to engage with the slot plate 16. By evacuating the groove 11g via an evacuation port 11G communicating therewith, the pressure in the gap formed between the slot plate 16 and the cover plate 15 is reduced and the radial line slot antenna 20 is urged firmly upon the cover plate 15 by the atmospheric pressure. Such a gap includes not only the slots 16a and 16b formed in the slot plate 16 but also a gap formed for other various reasons. Additionally, such a gap is sealed by the seal ring 11u provided between the radial line slot antenna 20 and the processing vessel 11.

Figure 3:
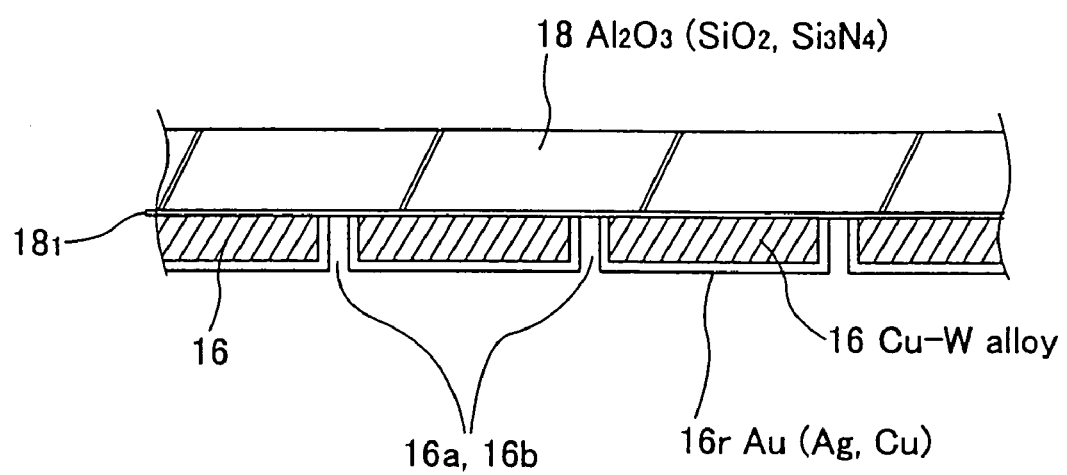
FIG. 3 is a diagram showing a part of the radial line slot antenna used in the plasma processing apparatus of FIGS. 2A and 2B in an enlarged scale.

Further, by filling the gap between the slot plate 16 and the cover plate 15 with an inert gas of small molecular weight via the evacuation port 11G and the groove 15g, heat transfer from the cover plate 15 to the slot plate 16 is facilitated. It is preferable to use He for such an inert gas in view of large thermal conductivity and large ionization energy. In the case the gap is filled with He, it is preferable to set the pressure to about 0.8 atm. In the construction of FIG. 3, there is provided a valve 11V on the evacuation port 11G for the evacuation of the groove 15g and filling of the inert gas into the groove 15g.

An outer waveguide tube 21A of the coaxial waveguide 21A is connected to the disk-shaped antenna body 17 while a central conductor 21B is connected to the slot plate 16 via an opening formed in the retardation plate 18. Thus, the microwave fed to the coaxial waveguide 21A is propagated in the radial direction between the antenna body 17 and the slot plate 16 and is emitted from the slots 16a and 16b.

FIG. 2B shows the slots 16a and 16b formed on the slot plate 16.

Referring to FIG. 2B, the slots 16a are arranged in a concentric manner such that there is provided a slot 16b for each slot 16a such that the slot 16b crosses the slot 16a perpendicularly and such that the slot 16b is aligned concentrically with the slot 16a. The slots 16a and 16b are formed with an interval corresponding to the wavelength of the microwave compressed by the radiation plate 16 in the radial direction of the slot plate 16, and as a result, the microwave is radiated from the slot plate 16 in the form of a near plane wave. Because the slots 16a and the slots 16b are formed in the mutually perpendicular relationship, the microwave thus radiated forms a circularly polarized wave including two perpendicular polarization components.

Further, in the plasma processing apparatus 10 of FIG. 2A, there is provided a cooling block 19 formed with a cooling water passage 19A on the antenna body 17, and the heat accumulated in the shower plate 14 is absorbed via the radial line slot antenna 20 by cooling the cooling block 19 by the cooling water in the cooling water passage 19A. The cooling water passage 19A is formed on the cooling block 19 in a spiral form, and cooling water having a controlled oxidation-reduction potential is supplied thereto, wherein the control of the oxidation reduction potential is achieved by eliminating oxygen dissolved in the cooling water by way of bubbling of an $H_2$ gas.

Figure 4:
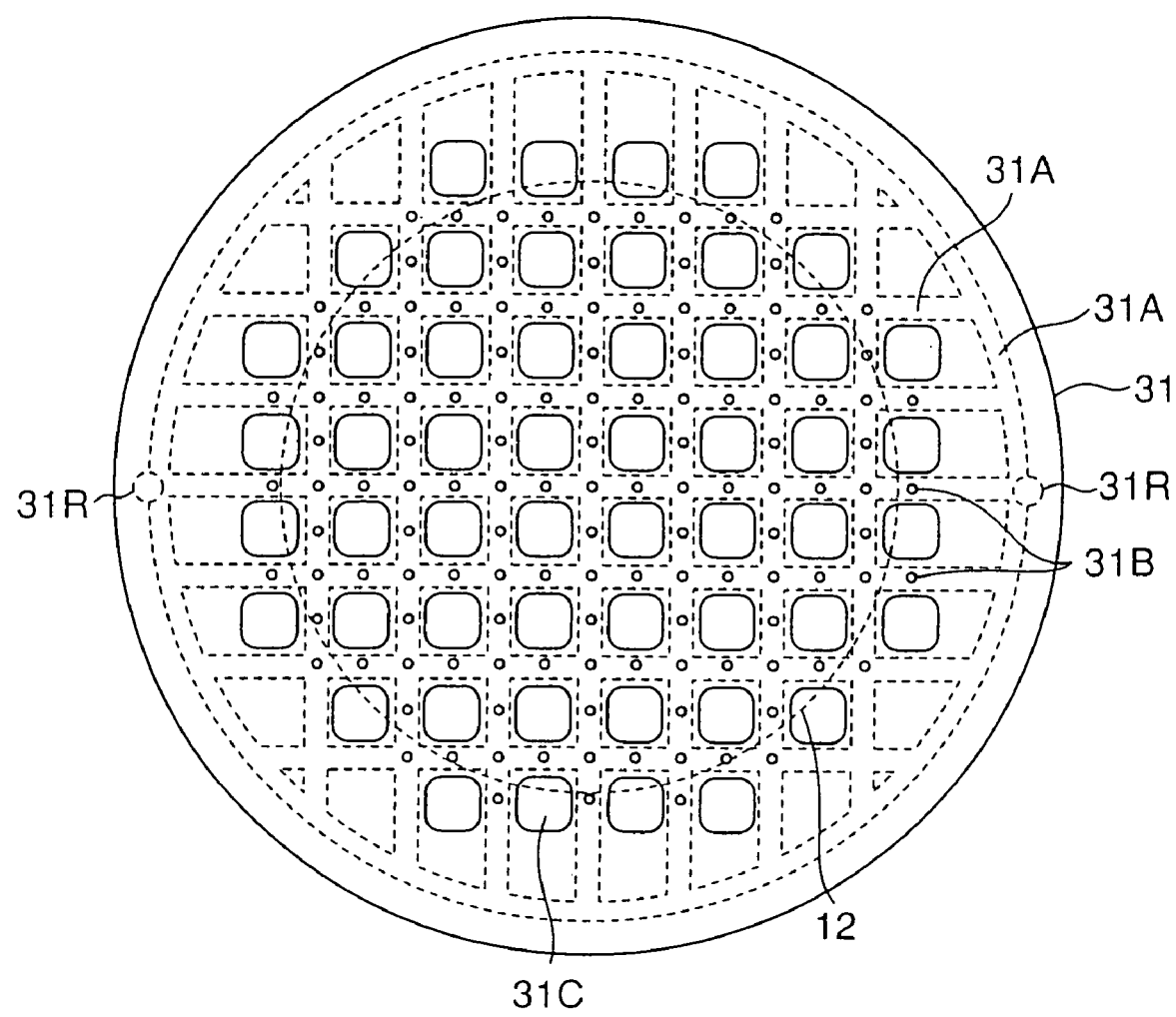
FIG. 4 is a diagram showing a process gas supply mechanism of the microwave plasma processing apparatus of FIG. 2A.

Additionally, in the microwave plasma processing apparatus 10 of FIG. 2A, there is further provided a process gas supply structure 31 in the processing vessel 11 between the shower plate 14 and the substrate 12 on the stage 13, wherein the process gas supply structure 31 has gas passages 31A arranged in a lattice shape and releases a process gas supplied from a process gas inlet port 11r provided on the outer wall of the processing vessel 11 through a large number of process gas nozzle apertures 31B (see FIG. 4). Thereby, desired uniform substrate processing is achieved in a space 11C between the process gas supply structure 31 and the substrate 12. Such substrate processing includes plasma oxidation processing, plasma nitridation processing, plasma oxynitridation processing, and plasma CVD processing. Further, it is possible to conduct a reactive ion etching of the substrate 12 by supplying a readily decomposing fluorocarbon gas such as $C_4F_8$, $C_5F_8$ or $C_4F_6$ or an etching gas containing F or Cl and further by applying a high-frequency voltage to the stage 13 from a high-frequency power source 13A.

In the microwave plasma processing apparatus 10 of the present embodiment, it is possible to avoid deposition of reaction byproducts on the inner wall of the processing vessel by heating the outer wall of the processing vessel 11 to a temperature of about 150° C. Thereby, the microwave plasma processing apparatus 10 can be operated constantly and with reliability, by merely conducing a dry cleaning process once a day or so.

FIG. 4 is a bottom view showing the construction of the process gas supply structure 31 of FIG. 2A.

Referring to FIG. 4, the process gas supply structure 31 is formed by a conductive body such as an Al alloy containing Mg or a stainless steel added with Al and the lattice shaped gas passage 31A is connected to the process gas inlet port 11r at a process gas supply port 31R and releases the process gas uniformly into the foregoing space 11C from the process gas nozzle apertures 31B formed at the bottom surface. Further, there are formed openings 31C in the process gas supply structure 31 between the adjacent process gas passages 31A for passing the plasma or the process gas contained in the plasma therethrough. In the case the process gas, supply structure 31 is formed of an Al alloy containing Mg, it is preferable to form a fluoride film on the surface thereof. In the case the process gas supplying structure 31 is formed of a stainless steel added with Al, it is preferable to form a passivation film of aluminum oxide on the surface thereof. In the plasma processing apparatus 10 of the present invention, the energy of incident plasma is low because of the low electron temperature of the excited plasma, and the problem of metal contamination of the substrate 12 by the sputtering of the process gas supply structure 31 is avoided. Further, it is possible to form the process gas supply structure 31 by a ceramic such as alumina.

The lattice shaped process gas passages 31A and the process gas nozzle apertures 31B are formed so as to encompass an area slightly larger than the substrate 12 represented in FIG. 4 by a broken line. By providing the process gas supply structure 31 between the shower plate 14 and the substrate 12 to be processed, the process gas is excited by the plasma and a uniform processing becomes possible by using such plasma excited process gas.

In the case of forming the process gas supply structure 31 by a conductor such as a metal, the process gas supply structure 31 can form a shunting plane of the microwave by setting the interval between the lattice shaped process gas passages 31A shorter than the microwave wavelength. In such a case, the microwave excitation of plasma takes place only in the space 11B, and there occurs excitation of the process gas in the space 11C including the surface of the substrate 12 by the plasma that has caused diffusion from the excitation space 11B. Further, such a construction can prevent the substrate being exposed directly to the microwave at the time of ignition of the plasma, and thus, damaging of the substrate by the microwave is avoided.

In the microwave plasma processing apparatus 10 of the present embodiment, the supply of the process gas is controlled uniformly by the process gas supply structure 31, and the problem of excessive dissociation of the process gas on the surface of the substrate 12 can be eliminated. Thus, it becomes possible to conduct the desired substrate processing even in the case there is formed a structure of large aspect ratio on the surface of the substrate 12 up to the very bottom of the high aspect ratio structure. This means that the microwave plasma processing apparatus 10 is effective for fabricating various semiconductor devices of different generations characterized by different design rules.

Figure 5:
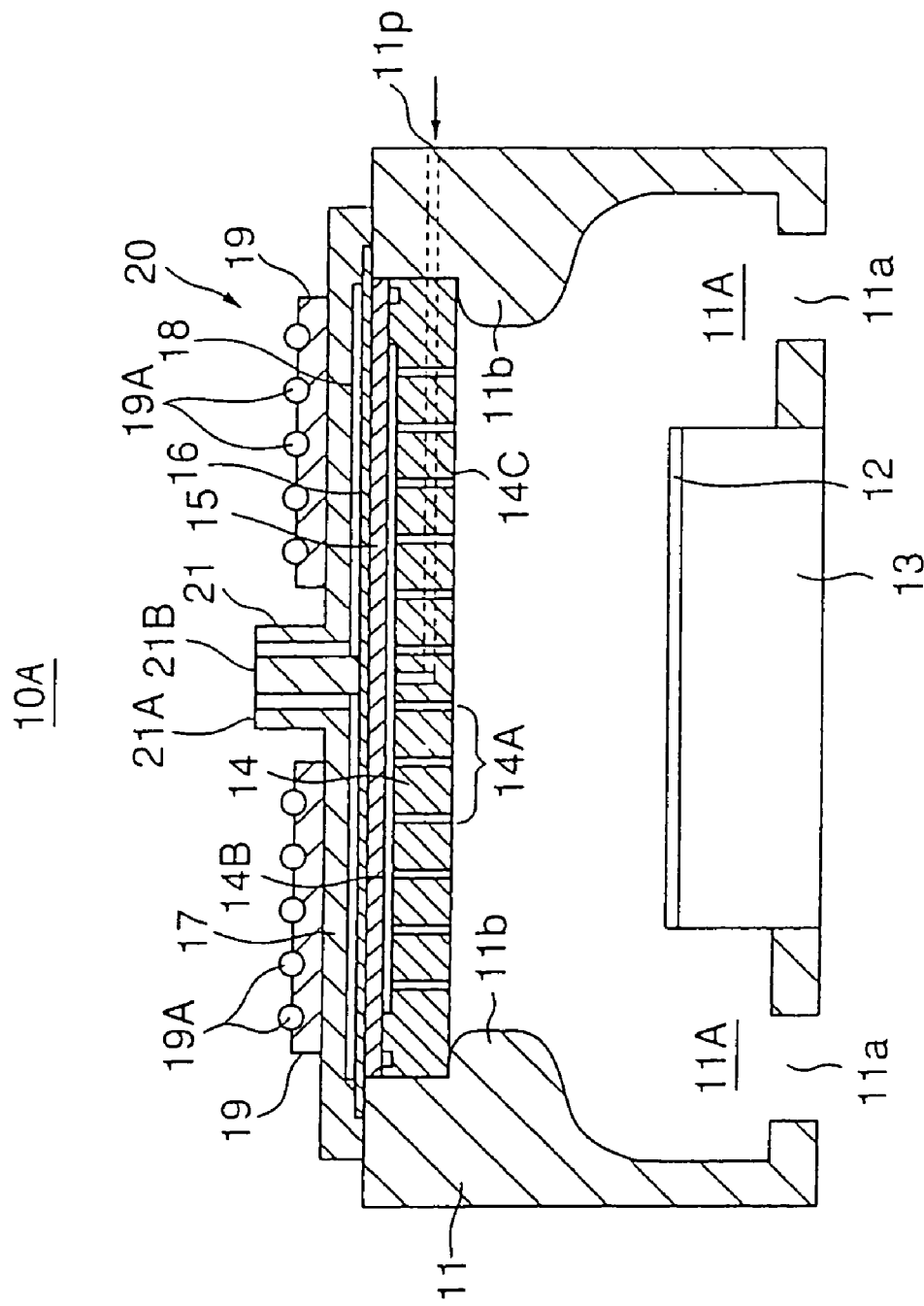
FIG. 5 is a diagram showing a variation of the plasma processing apparatus of FIGS. 2A and 2B.

In the plasma processing apparatus 10 according to the present embodiment, it is also possible to remove the processing gas supply part 31, similar to the plasma processing apparatus 10A shown in FIG. 5, depending on the application. However, in FIG. 5, parts that are explained previously are given the same reference numerals, and descriptions thereof will be omitted.

The structure of FIG. 5 enables formation of an oxide film, a nitriding film or an oxinitriding film on the surface of the above-mentioned substrate 12 to be processed by introducing an oxidizing gas such as $O_2$ or a nitriding gas like NH₃ or a mixture gas of N₂ and H₂ together with an inert gas such as Ar or Kr from the above-mentioned shower plate 14.

Since the difference in thermal expansion between the slot plate 16 and the wave retardation plate 18 is controlled to 10% or less in the present embodiment, even if a large amount of heat fluxes, which is caused by the high-density plasma, is supplied to the antenna 20 from the processing vessel 11 and the temperature of the slot plate 16 and the wave retardation plate 18 is increased, there is no gap formed between the slot plate 16 and the waver retardation plate 18, and, thus, problems associated with an abnormal electric discharge, formation of a reflecting wave or formation of a stationary wave can be eliminated effectively.

SECOND EMBODIMENT

Figure 6:
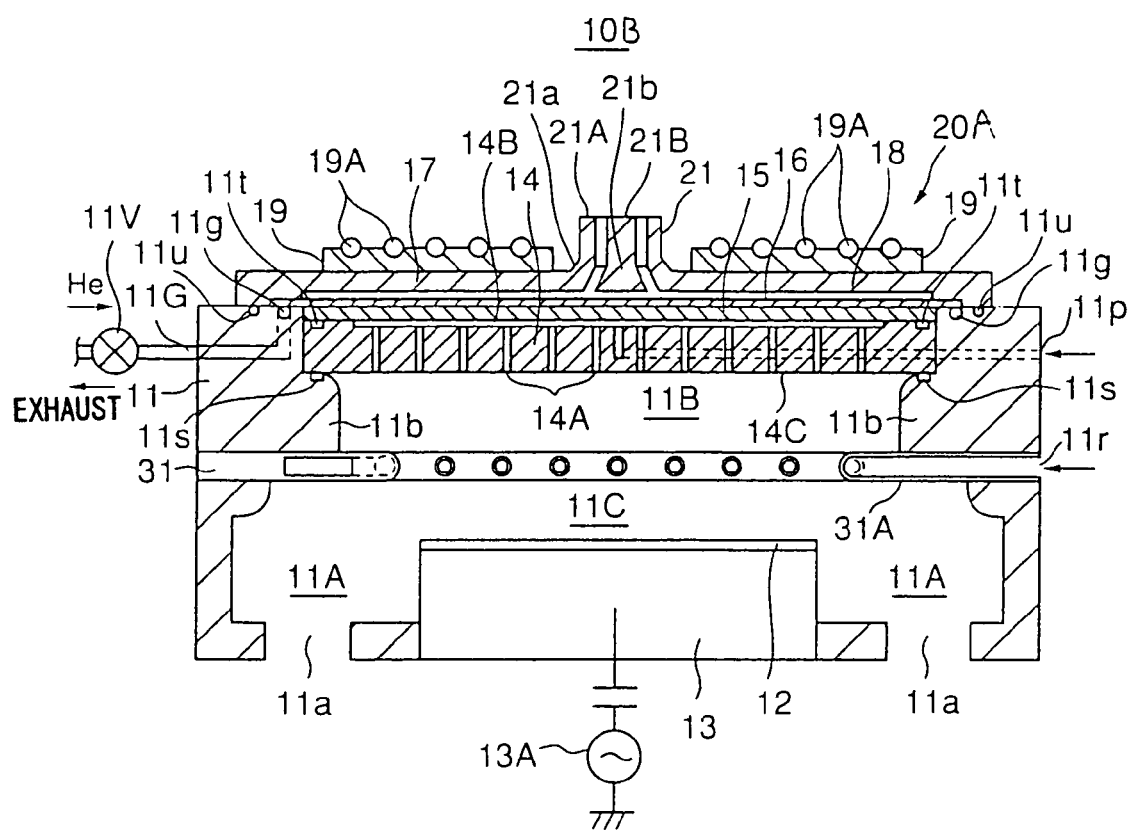
FIG. 6 is a diagram showing the construction of a plasma processing apparatus according to a second embodiment of the present invention.

FIG. 6 shows a composition of a plasma processing apparatus 10B according to a second embodiment of the present invention. In FIG. 6, parts that are explained previously are given the same reference numerals, and descriptions thereof will be omitted.

With reference to FIG. 6, a microwave antenna 20A is used instead of the microwave antenna 20 of FIG. 2A in the present embodiment. In the microwave antenna 20A, an end portion 21b of a core conductor 21B of a coaxial waveguide 21 is separated from the slot plate 16, and is coupled to a back of the wave retardation plate 18 formed on the slot plate 16. With this composition, a microwave can be efficiently supplied without bringing the core conductor 21B into contact with the slot plate 16. In the above-mentioned microwave antenna 20A, the wave retardation plate 18 is continuously extended on the back of the slot plate 16, and the contact hole for the core conductor is not formed.

FIGS. 7A–7D are illustrations showing the formation process of the wave retardation plate 18 and the slot plate 16 in the radial line slot antenna 20A used in the above-mentioned plasma processing apparatus 10B.

Figure 7A:
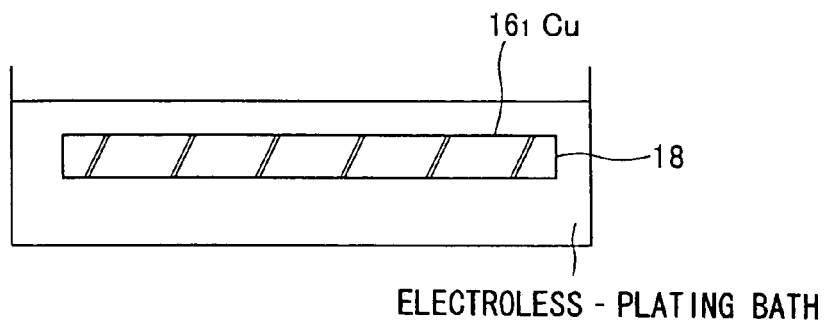
FIGS. 7A–7D are diagrams showing forming process of a slot plate of a radial line slot antenna used in the plasma processing apparatus of FIG. 6.

With reference to FIG. 7A, first the wave retardation plate 18, which is formed of Al2O3, SiO2, or Si3N4, is immersed into the electroless-plating liquid of Cu in the electroless-plating bath Bath1 so that an electroless-Cu-plating layer 161 of at least one atomic layer is formed on the surface.

Figure 7B:
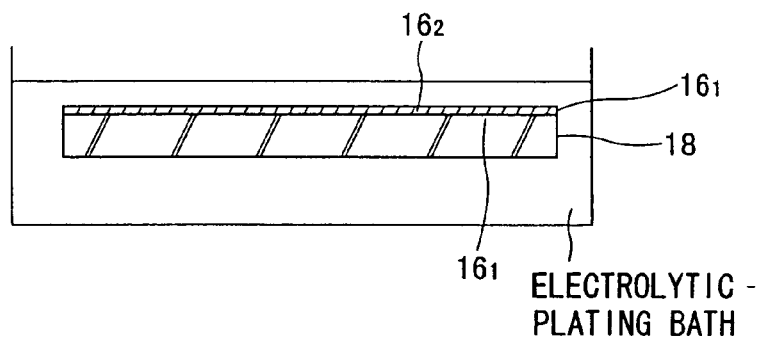

Electroless plating of FIG. 7A may be continued further so as to deposit the electroless-Cu-plating layer on the wave retardation plate 18 with a desired thickness. From a viewpoint of improving adhesion, it is preferable that the wave retardation plate 18, which has the electroless-Cu-plating layer 161 formed in the process of FIG. 7A, is immersed into an electrolyti-plating liquid in an electrolytic plating bath Bath2 as shown in FIG. 7B so as to form an electrolytic Cu plating layer 162 on the electroless-Cu-plating layer 161 with a desired thickness by using the electroless-Cu-plating layer as an electrode. It is preferable that the desired thickness of the above-mentioned Cu layer 162 is 6 micrometers or more in consideration of the skin effect of a microwave.

Figure 7C:
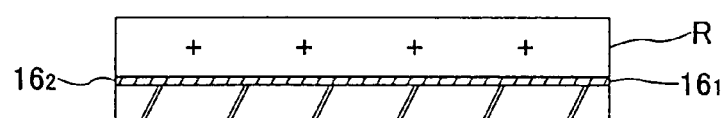
Figure 7D:
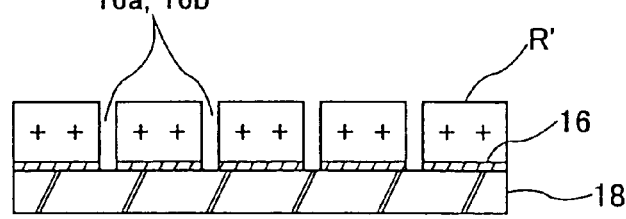

The thus-formed Cu layers 161 and 162 are covered by a resist film R in the process of FIG. 7C, and are exposed and developed in the process of FIG. 7D so as to patterning the Cu layers 161 and 162 using the formed resist pattern R' as a mask, which results in the slot plate 16 having the slots 16a and 16b. Additionally, it is also possible to pattering the Cu layers 161 and 162 by wet-etching after applying a film having a desired pattern as a mask.

The slot plate 16 formed by the above-mentioned process has an excellent adhesion force due to fine unevenness on the surface of the wave retardation plate 18 even if formed by Cu, which is effective for preventing formation of a gap between the slot plate 16 and the wave retardation plate 18.

It should be noted that, although explained before, the slot plate 16 may be formed by electroless-plating. Further, in the example of FIGS. 7A–7D, it is also possible to use a nickel plating layer instead of the above-mentioned electroless-Cu-plating layer 161.

In the embodiment of FIG. 6, it is also possible to remove the above-mentioned processing gas supply configuration depending on the application of the plasma processing apparatus.

Figure 1A:
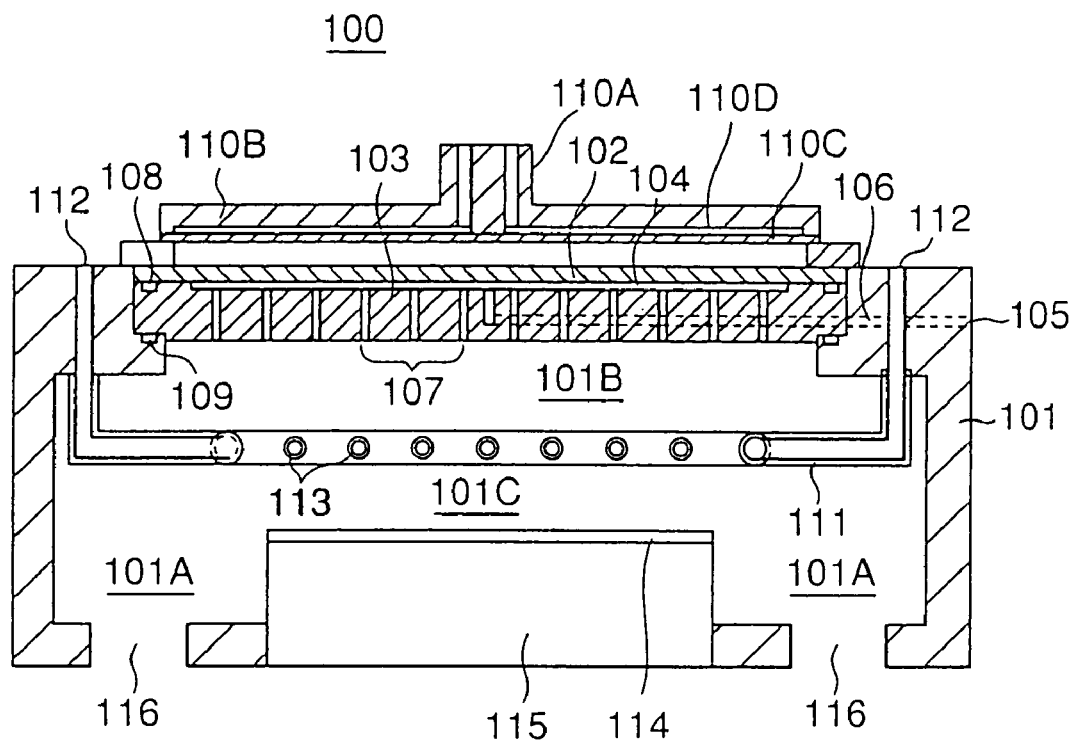
FIGS. 1A and 1B are diagrams showing the construction of a conventional microwave plasma processing apparatus that uses a radial line slot antenna.
Figure 1B:
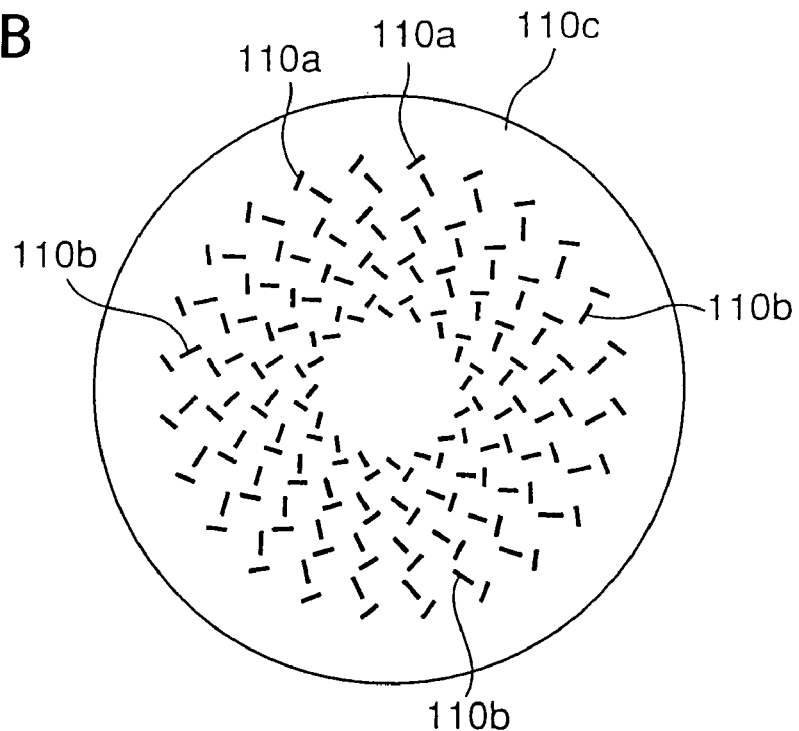

It should be noted that, the formation approach of the slot plate 16 according to the process of FIGS. 7A–7D is applicable also to the plasma processing apparatus 10 of FIGS. 2A and 2B or the plasma processing apparatus 10A of FIG. 5, and further to the conventional plasma processing apparatus 100 shown in FIGS. 1A and 1B.

THIRD EMBODIMENT

Figure 8:
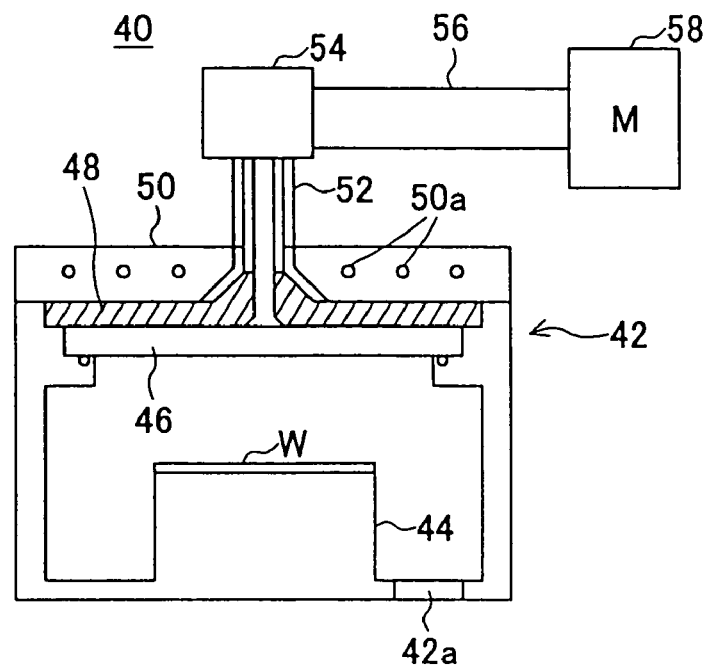
FIG. 8 is an outline diagram of a microwave plasma processing apparatus according to a third embodiment of the present invention.

FIG. 8 is an outline structure diagram of a microwave plasma processing apparatus according to an embodiment of the present invention.

The microwave plasma processing apparatus 40 shown in FIG. 8 is, for example, a plasma CVD apparatus, which applies plasma CVD processing to a semiconductor wafer W as a substrate to be processed in a processing vessel 42. The processing vessel 42 is formed of aluminum, for example, and has a hermetic construction so as to be evacuatable. There is provided a placement table 44 for placing the semiconductor wafer W in the processing container 42.

The bottom of the processing vessel 42 is provided with an exhaust port 42a to which a vacuum pump (not shown) is connected so that the interior of the processing vessel 42 can be maintained in a predetermined low-pressure state.

The dielectrics plate 46 is airtightly attached to a ceiling part of the processing vessel 42. In the present embodiment, a wave retardation plate 48, which has at least an upper surface and a lower surface being plated, is attached to the top surface face of the dielectric plate 46. In the present embodiment, since a microwave radiation member is formed by the plating layer of the wave retardation plate 48, there is no need to provide an antenna member as the microwave radiation member separately from the wave retardation plate 48. A description regarding the plated wave retardation plate 48 will be given later.

The wave retardation plate 48 is attached to a support member 50. The support member 50 has a function to cool the wave retardation plate 48 while supporting the wave retardation plate 48.

Namely, a passage 50a through which cooling water flows is formed in the interior of the support member 50, and the wave retardation plate 48 is cooled at the time of plasma processing. Connected to a center section of the wave retardation plate 48 is a coaxial waveguide 52 for supplying a microwave. The coaxial waveguide 52 is connected to a waveguide 56 through a coaxial waveguide converter 54, and the waveguide 56 is connected to the microwave generator 58, which consists of a magnetron or the like.

In the above-mentioned composition, a 2.45 GHz microwave generated by the microwave generator 58 propagates through the waveguide 56, and is supplied to the coaxial waveguide 52 through the coaxial waveguide converter 54. After a wave length is reduced by the wave retardation plate 48, the microwave which propagate through the coaxial waveguide 52 transmits through the dielectric plate 46 and is radiated by the microwave radiation member formed of the plating layer formed on the surface of the wave retardation plate 48 towards the processing space of the processing vessel 42.

A gas for plasma is supplied to the processing space in the processing vessel 42, and the gas for plasma is turned into plasma by the microwave. By this plasma, the plasma processing is performed on the semiconductor wafer W placed on the placement table 44.

Figure 9:
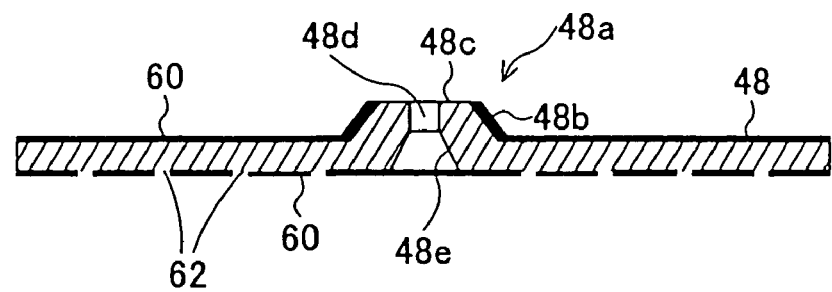
FIG. 9 is a cross-sectional view of a wave retardation plate shown in FIG. 8.
Figure 10:
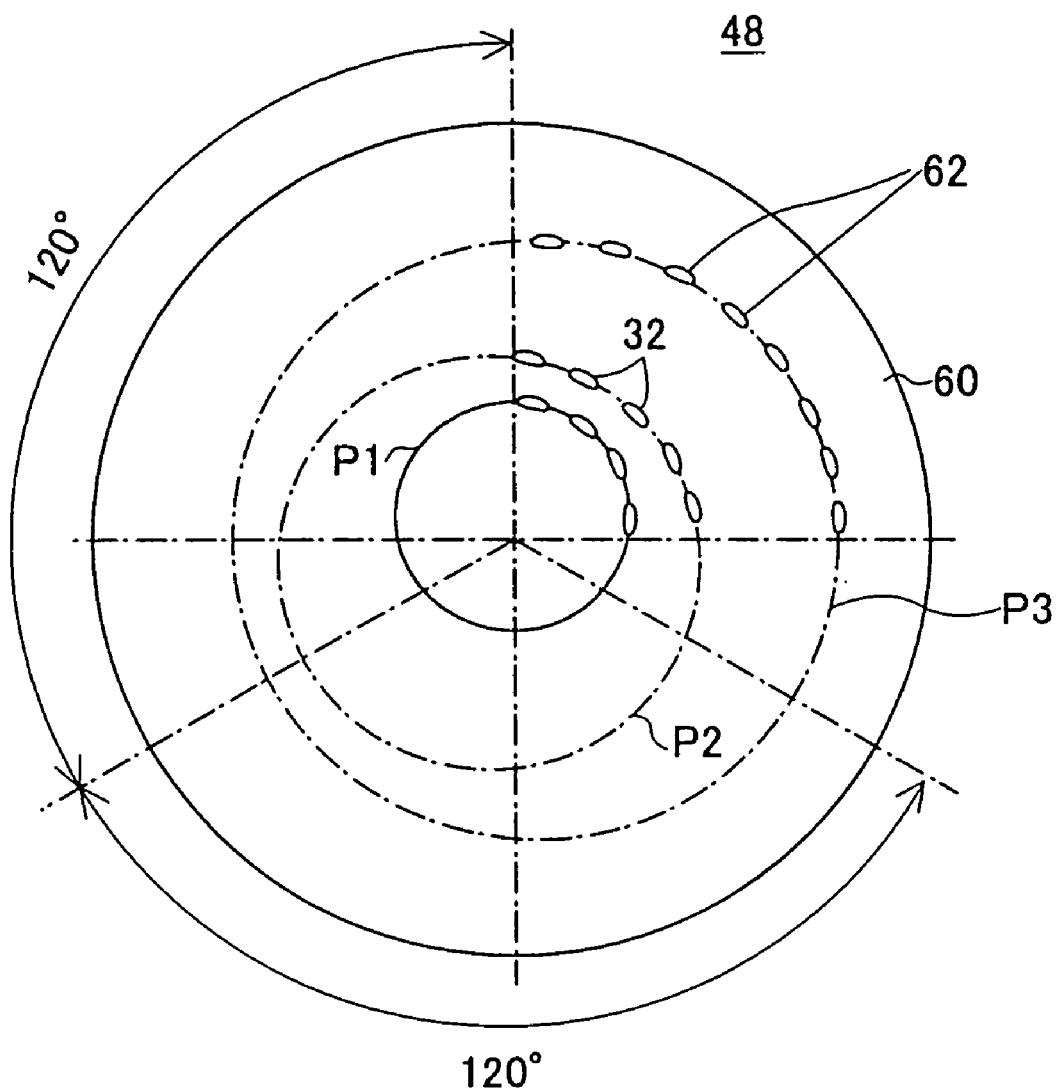
FIG. 10 is a plan view showing slots in a metal plating layer formed on the wave retardation plate shown in FIG. 8.

Next, a description will be given, with reference to FIG. 9, of the wave retardation plate 48 in the present embodiment. FIG. 9 is a cross-sectional view of the wave retardation plate 48.

The wave retardation plate 48 is formed of a dielectric material such as alumina ($Al_2O_3$), silicon nitride ($Si_3N_4$), aluminum nitride (AlN) or quartz, and has a flat disc configuration. A protruding part 48a to which the coaxial waveguide 22 is connected is formed in the center section of the wave retardation plate 48. The protruding part 48a has a slanting surface 48b which forms a part of a cone form so as to prevent concentration of an electric field due to the microwave. An outer tube 52a of the coaxial waveguide 52 is connected to the protruding part 48a. The outer tube 52a of the protruding part 48a may be connected to a flat top surface 48c, or connected to the slanting surface 48b.

A through hole 48d, into which an inner cable of the coaxial waveguide 52 is inserted, formed in the center of the protruding part 48a. A taper part 48e is formed on an end of the through hole 48 on the processing vessel side so that an end of the inner cable 52b, which is formed in a configuration corresponding to the configuration of the taper part, fits thereto.

Here, a metal plating layer 60 of copper, gold, silver, nickel, etc. is formed in the surface of the wave retardation plate 48. The metal plating layer 60 is formed over the entire surface wave retardation plate 48 except for the top surface 48c of the protruding part 48a. Especially, the plating layer 60 formed on the surface facing the interior of the processing vessel 42 of the wave retardation plate 48 is etched in a predetermined pattern, and a part from which the plating layer is removed functions as a slot.

FIG. 3 is a plan view showing the surface where the slots 32 are formed in the metal plating layer 60 of the wave retardation plate 48. As shown in FIG. 3, each of the slots 32 has an elongated oblong shape, and the slots 32 are arranged along three different peripheries P1, P2 and P3. It should be noted that although the slots 32 are provided along an entire periphery of each of the peripheries P1, P2 and P3, FIG. 3 shows only a part thereof for the sake of simplification. Here, the center of the peripheries P1, P2 and P3 is offset (eccentric) from the center of the outer configuration of the wave retardation plate 48, and the directions of offset (eccentric direction) are different from each other.

That is, the direction where the center of the middle periphery P2 shifts from the center of the outside configuration of the wave retardation plate 48 differs 120 degrees from the direction where the center of the inside periphery P1 shifts from the center of the outside configuration of the wave retardation plate 48. Moreover, the directions where the center of the outside periphery P3 shifts from the center of the outside configuration of the wave retardation plate 48 differs 120 degrees from the direction where the center of the middle periphery P2 shifts from the center of the outside configuration of the wave retardation plate 48. Thus, the centers of the peripheries P1, P2 and P3 are shifted in different directions from each other.

Thus, when the slots 32 are arranged along a plurality of non-concentric circles, although a surface wave which propagates in the metal plating layer 30 in a radiation direction and reflected by an outer surface returns toward the center part of the wave retardation plate 48, there is no concentration into the center point of the wave retardation plate 48. That is, the surface wave returns to a range of certain size accordance with an amount of offset of each of the peripheries P1, P2 and P3. Therefore, according to the arrangement of the slots 62 of the present embodiment, an unevenness in the electron density is improved in comparison with the conventional flat antenna member in which a surface wave is concentrated into a point which generates unevenness in the electron density of the plasma space when peripheries P1, P2, and P3 are concentric circles, and, thus, the plasma density distribution can be uniform in some degrees.

It should be noted that although the slots 62 shown in FIG. 3 are arranged along a plurality of non-concentric circles, the slots may be arranged spirally or also along a plurality of concentric circles. Moreover, although the configuration of the slot 62 is not restricted to an elongated oblong shape as shown in FIG. 3 and can adopt configurations such as a circle, a triangle, a square or a rectangle, it is preferable to round each corner in a case of a polygon so as to prevent concentration of an electric field. Moreover, a slot pair is made by arranging two slots adjacent to each other in a T-shape, and a plurality of slot pairs may be arranged along a plurality of concentric circles, a spiral or a plurality of non-concentric circles.

As for the thickness of the plating layer 60, it is preferable to make it thicker than a skin depth delta of a microwave, and also preferable to determine in accordance with the following formulas is preferable.

$$\delta = (2/\omega\sigma\mu 0)^{1/2}$$

Where $\omega$ is an angular frequency, $\sigma$ is a conductivity, and $\mu 0$ is a permeability in a vacuum.

When the plating layer 60 is formed by copper plating using a microwave of 2.45 GHz, a skin depth $\delta = 1.98 \times 10^{-6}$ m=1.98 µm (about 2 µm) since a conductivity of copper $\sigma = 6.45 \times 10^{-7}$ $(\Omega m)^{-1}$, a permeability $\mu 0 = 1.257 \times 10^{-6}$ $Hm^{-1}$ and an angular frequency is $2\pi \times 2.45 \times 10^9$ Hz. Here, since a reduction in the electric field within the skin depth of the plating layer is about 30%, it is preferable that the thickness of the plating layer 60 made of copper is about 6 µm in consideration of a margin rate of three times.

As mentioned above, since the metal plating layer 60 is formed and the metal plating layer 60 achieves the function of an antenna member (microwave radiation member) in the wave retardation plate 48, there is no need to provide an antenna member separately, which reduces a number of parts. Moreover, since the surface of the wave retardation plate 48 is covered by the metal plating layer 60 in its entirety except for the part which supplies a microwave and the part (slot) to emit a microwave, it is prevented that the microwave leaks out of the wave retardation plate 48 and the supplied microwave can be introduced into the processing space of the processing vessel without loss.

Moreover, since the metal member in which the slots are formed is the metal plating layer 30 having a thickness of about several micrometers, an abnormal electric discharge is reduced and a larger power than conventional can be supplied, the throughput of the plasma processing is improved. Moreover, since the thickness of the slot part is small, reflection of the microwave by the slots decreases and the radiation efficiency is improved.

Figure 11:
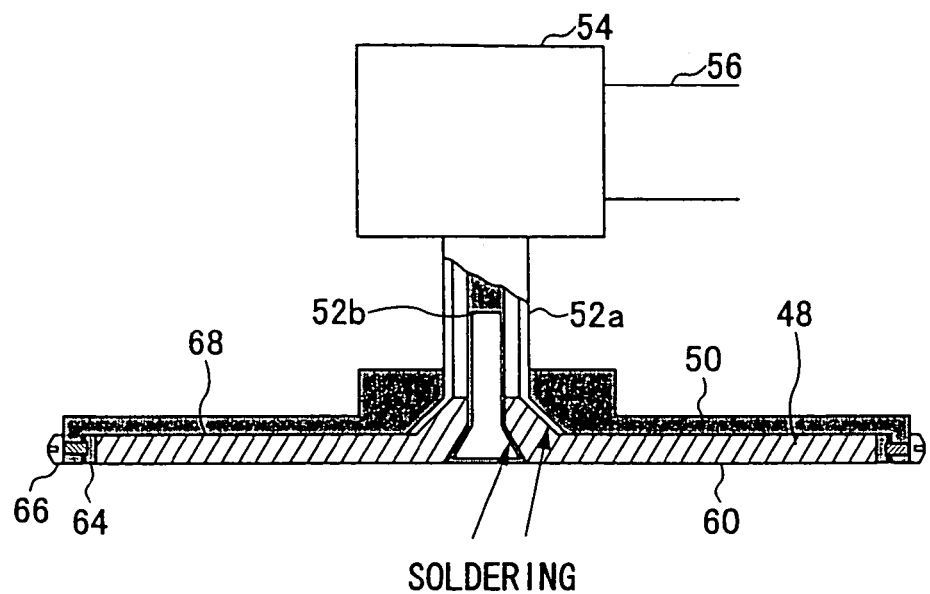
FIG. 11 is a cross-sectional view showing an example of a connection between a coaxial waveguide and a wave retardation plate.

FIG. 11 is a cross-sectional view showing an example of connection between the coaxial waveguide 52 and the wave retardation plate 48. In the composition shown in FIG. 11, an end of the outer tube 52a of the coaxial waveguide 52 is made into a configuration corresponding to the slanting surface 48b of the protruding part 48a of the wave retardation plate 48, and is joined by soldering. Additionally, an end of the inner cable 52b is also joined to an inner surface and the taper part 48e of the through hole 48 by soldering. The wave retardation plate 48 is firmly fixed to the support member 50 and heat in the wave retardation plate 48 is transmitted to the support member 50 by providing an adhesive 68 having a good heat transmission characteristic between the wave retardation plate 48 (the plating layer 60 formed on the surface of the wave retardation plate 48 in fact) and the support member 50.

It should be noted that a passage of the cooling water is omitted from the support member 50 shown in FIG. 11. Moreover, the outer side surface of the wave retardation plate 48 is fixed by being pressed via a metal plate 64 by many screws 66 that penetrates the support member 50. Thereby, the positive electric contact between the wave retardation plate 48 and the support member is maintained.

Figure 12:
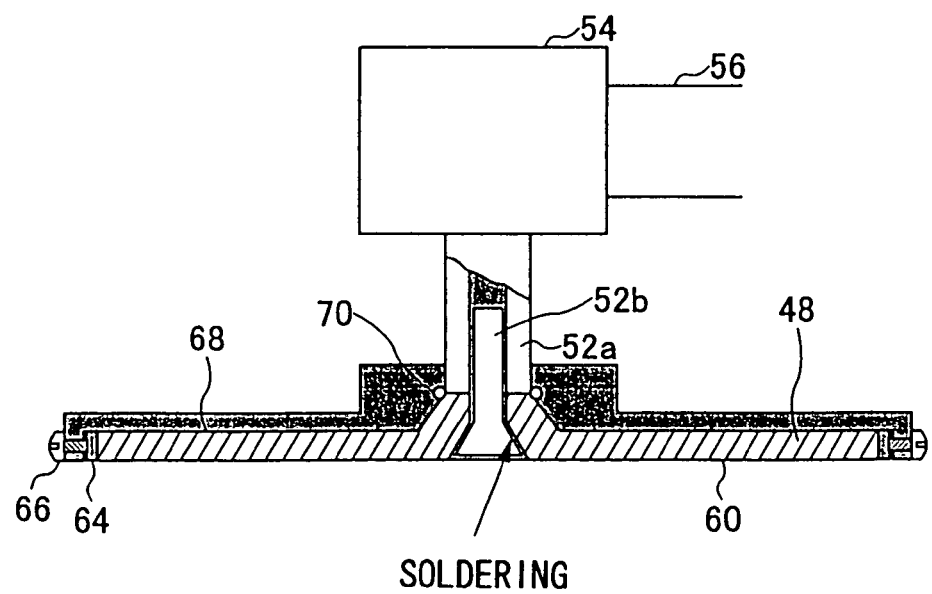
FIG. 12 is a cross-sectional view showing another example of the connection between the coaxial waveguide and the wave retardation plate.

FIG. 12 is a cross-sectional view showing an example of connection between the coaxial waveguide 52 and the wave retardation plate 48. In FIG. 12, parts that are the same as the parts shown in FIG. 11 are given the same reference numerals, and descriptions thereof will be omitted. In the composition shown in FIG. 12, the end of the outer tube 52a of the coaxial waveguide 52 is opposed and brought into contact with the top surface 48a of the protruding portion 48a of the wave retardation plate 48. Additionally, the end of the inner cable 52b is joined to the inner surface and the taper part 48e of the through hole 48d by soldering. Moreover, a shield spiral 70 is provided on an end portion of the slanting surface 48b of the protruding part 48a so as to ensure the electrical connection between the support member 50 and the metal plating layer 60 of the wave retardation plate 48.

It should be noted that the plating layer 60 according to the present embodiment can be formed by the same method as the plating layer according to the above-mentioned second embodiment. Moreover, although a plating layer is formed on the upper surface and the lower surface of the wave retardation plate, the plating layer may be provided on an outer side surface of the wave retardation plate. Such a structure results in the wave retardation plate covered by the plating layer in its entirety, which prevents leakage of a microwave and can prevent an abnormal discharge almost over the entire wave retardation plate.

Moreover, with the above-mentioned second and third embodiments, although the metal layer is formed by plating on the surface of the wave retardation plate, it is not limited to the plating layer. For example, the metal layer may be formed by depositing a metal on the surface of the wave retardation plate by a chemical vapor deposition method (CVD) or a physical vapor deposition method (PVD).

INDUSTRIAL APPLICABILITY

According to the present invention, by forming the slot plate by a Cu—W alloy in the microwave plasma processing apparatus using the radial line slot antenna, a difference in the coefficient of thermal expansion between the slot plate and the dielectric plate constituting the wave retardation plate can be minimized, and the antenna having no change in the microwave radiation characteristic even if heated can be realized. Additionally, an ideal intimate contact can be realized between the wave retardation plate and the slot plate by forming the slot plate by the plating layer, and the microwave radiation characteristic does not change even if overheated, and, thus, an antenna which can prevent an abnormal electric charge can be realized. Further, the abnormal electric charge in the upper surface and the lower surface of the wave retardation plate can be prevented by forming a metal layer such as a plating layer on the upper surface and the lower surface of the wave retardation plate.

The invention claimed is:

1. A plasma processing apparatus, comprising:
a processing vessel defined by an outer wall and having a stage for holding a substrate to be processed;
an evacuation system coupled to said processing vessel;
a plasma gas supplying part supplying plasma gas to said processing vessel; and
a microwave antenna provided on said processing vessel in correspondence to said plasma gas supplying part and supplied with an electric power from a coaxial waveguide,
wherein said microwave antenna comprises: a radial line back surface metal plate having openings; a microwave radiation surface provided on said radial line back surface metal plate so as to cover said openings and having a plurality of slots; and a dielectric plate provided between said radial line back surface metal plate and said microwave radiation surface,
wherein said microwave radiation surface is formed by an electrically conductive material, wherein a difference in a coefficient of thermal expansion between said dielectric plate said electrically conductive material within 10% with respect to a coefficient of thermal expansion of said dielectric plate;
wherein said dielectric plate is formed of alumina ceramics, and said microwave radiation surface is formed of an alloy of Cu and W.

2. The plasma processing apparatus as claimed in claim 1, wherein said dielectric plate is made of $Al_2O_3$.

3. The plasma processing apparatus as claimed in claim 1, wherein said microwave radiation surface comprises a base member of a conductive material and a plated layer formed of Ni, Au, Ag or Cu and covering a surface of said base member.

4. The plasma processing apparatus as claimed in claim 3, wherein said plated layer has a thickness of equal to or greater than 6 µm.

5. The plasma processing apparatus as claimed in claim 1, wherein said microwave radiation surface and said dielectric plate are bonded by a ceramic adhesive.

6. The plasma processing apparatus as claimed in claim 1, wherein said microwave radiation surface and said dielectric plate are bonded by an electrically conductive adhesive.

* * * * *

UNITED STATES PATENT AND TRADEMARK OFFICE
CERTIFICATE OF CORRECTION

| | |
|---|---|
| PATENT NO. | : 7,083,701 B2 |
| APPLICATION NO. | : 10/296619 |
| DATED | : August 1, 2006 |
| INVENTOR(S) | : Tadahiro Ohmi et al. |

It is certified that error appears in the above-identified patent and that said Letters Patent is hereby corrected as shown below:

In the title, "Device and Method for Plasma Processing, and Slow-Wave Plate" should read --Plasma Processing Apparatus, Plasma Processing Method and Wave Retardation Plate--.

On the title page, item (30) insert --Nov. 6, 2001 (JP) ................ 2001-340995--.

In claim 1, column 16, line 37, "plate said" should read --plate and said--.

In claim 1, column 16, line 37, "material within" should read --material is within--.

In claim 1, column 16, line 39, after "plate;" insert --and--.

Signed and Sealed this

Thirty-first Day of October, 2006

JON W. DUDAS
*Director of the United States Patent and Trademark Office*

UNITED STATES PATENT AND TRADEMARK OFFICE
CERTIFICATE OF CORRECTION

PATENT NO.       : 7,083,701 B2  Page 1 of 1
APPLICATION NO.  : 10/296619
DATED            : August 1, 2006
INVENTOR(S)      : Tadahiro Ohmi et al.

It is certified that error appears in the above-identified patent and that said Letters Patent is hereby corrected as shown below:

On the title page, item (73), insert --Tadahiro Ohmi, Sendai (JP)--.

Signed and Sealed this

Fourteenth Day of October, 2008

JON W. DUDAS
*Director of the United States Patent and Trademark Office*